(12) United States Patent
Hoshio et al.

(10) Patent No.: US 7,553,891 B2
(45) Date of Patent: Jun. 30, 2009

(54) FLAME-RETARDANT EPOXY RESIN COMPOSITION, AND ELECTRONIC DEVICE, LAMINATED CIRCUIT BOARD, MULTILAYERED CIRCUIT BOARD AND PRINTED CIRCUIT BOARD USING THE FLAME-RETARDANT EPOXY RESIN COMPOSITION

(75) Inventors: Takuro Hoshio, Minamiashigara (JP); Hitoshi Okazaki, Minamiashigara (JP); Masayuki Okoshi, Minamiashigara (JP); Michiaki Yasuno, Minamiashigara (JP)

(73) Assignee: Fuji Xerox Corporation, Tokyo (JP)

( * ) Notice: Subject to any disclaimer, the term of this patent is extended or adjusted under 35 U.S.C. 154(b) by 355 days.

(21) Appl. No.: 11/202,216

(22) Filed: Aug. 12, 2005

(65) Prior Publication Data

US 2006/0217462 A1 Sep. 28, 2006

(30) Foreign Application Priority Data

Mar. 28, 2005 (JP) ............................. 2005-093054

(51) Int. Cl.
*C08K 5/00* (2006.01)

(52) U.S. Cl. ...................................... 523/458; 428/413
(58) Field of Classification Search ................. 523/458; 428/413
See application file for complete search history.

(56) References Cited

U.S. PATENT DOCUMENTS

| | | | |
|---|---|---|---|
| 4,283,316 A * | 8/1981 | Bonsignore | 524/322 |
| 4,769,179 A * | 9/1988 | Kato et al. | 252/609 |
| 4,791,160 A * | 12/1988 | Kato et al. | 524/322 |
| 5,284,889 A * | 2/1994 | Pyun et al. | 524/94 |
| 5,665,155 A * | 9/1997 | Hohner et al. | 106/287.14 |
| 6,682,801 B2 * | 1/2004 | Imahashi et al. | 428/90 |
| 6,746,640 B2 * | 6/2004 | Weberg et al. | 264/271.1 |
| 6,797,386 B2 * | 9/2004 | Yabui et al. | 428/413 |
| 6,858,300 B2 * | 2/2005 | Kinose et al. | 428/407 |
| 2003/0039671 A1 * | 2/2003 | Tournilhac et al. | 424/401 |
| 2003/0104743 A1 * | 6/2003 | Weberg et al. | 442/286 |
| 2004/0076805 A1 * | 4/2004 | Oohori et al. | 428/209 |
| 2005/0113500 A1 * | 5/2005 | Okoshi et al. | 524/405 |
| 2006/0293415 A1 * | 12/2006 | Miyamoto et al. | 523/212 |
| 2007/0173563 A1 * | 7/2007 | Okoshi et al. | 523/200 |
| 2008/0039556 A1 * | 2/2008 | Ikezawa et al. | 523/451 |

FOREIGN PATENT DOCUMENTS

| | | | |
|---|---|---|---|
| JP | 06322276 A | * | 11/1994 |
| JP | A 2001 323169 | | 11/2001 |
| JP | A 2002-30200 | | 1/2002 |
| JP | A 2003-64185 | | 3/2003 |
| JP | A 2003-192874 | | 7/2003 |

OTHER PUBLICATIONS

Machine Translation of JP 0632276.*
English translation of JP 06322276.*
Okoshi, "Processing and Flameretardancy of Novel organic-inorganic Nanocomposite," Doctoral thesis, Kyoto Institute of Technology, No. kou-305, Feb. 18, 2004, Kyoto Japan.

* cited by examiner

Primary Examiner—James Seidleck
Assistant Examiner—Megan McCulley
(74) Attorney, Agent, or Firm—Oliff & Berridge, PLC

(57) ABSTRACT

A flame-retardant epoxy resin composition, as well as an electronic device, a laminated circuit board, a multilayered circuit board and a printed circuit board employing the flame-retardant epoxy resin composition are disclosed. The flame-retardant epoxy resin composition contains: an epoxy resin; an epoxy resin curing agent; and flame-retardant particles containing a metal hydrate. The flame-retardant particles are provided with a coating layer on the surfaces thereof and have a volume average particle diameter in a range from 1 to 500 nm.

20 Claims, No Drawings

FLAME-RETARDANT EPOXY RESIN COMPOSITION, AND ELECTRONIC DEVICE, LAMINATED CIRCUIT BOARD, MULTILAYERED CIRCUIT BOARD AND PRINTED CIRCUIT BOARD USING THE FLAME-RETARDANT EPOXY RESIN COMPOSITION

CROSS-REFERENCE TO RELATED APPLICATION

This application claims priority under 35 USC 119 from Japanese Patent Application No. 2005-93054, the disclosure of which is incorporated by reference herein.

BACKGROUND OF THE INVENTION

1. Field of the Invention

The present invention relates to a flame-retardant epoxy resin composition formed by mixing flame-retardant particles to an epoxy resin, and an electronic device, a laminated circuit board, a multilayered circuit board and a printed circuit board using the flame-retardant epoxy resin composition.

2. Description of the Related Art

Resin compositions containing an epoxy resin, which is a thermosetting resin having good mechanical strength, electrical characteristics, chemical resistance, etc., have been used in sealing materials for sealing ICs and LSIs, in laminated circuit board, in multilayered circuit boards, and in printed circuit boards. In order to add flame resistance to resin compositions containing an epoxy resin, flame-retardant agents such as brominated epoxy resin have been conventionally added to the resin compositions.

However, although halogen based flame-retardant agents such as brominated epoxy resin exhibit superior flame retardancy, they might produce harmful brominated dioxines through thermal decomposition of the halogen based flame-retardant agents. Therefore, various flame-retardant agents for replacing the halogen based flame-retardant agents have been studied.

Typical examples of flame-retardant agents that replace the halogen based flame-retardant agents are metal hydroxides (metal hydrates), as described in Japanese Patent Application Laid-Open (JP-A) Nos. 2002-30200, 2003-192874, 2001-323169 and 2003-64185. In a case where a metal hydrate is mixed in an epoxy resin, it is preferred to form a uniform coating layer on surfaces of particles of the metal hydrate so as to improve dispersibility of the particles in the epoxy resin and to prevent deterioration of resin characteristics due to an active group included in the metal hydrate affecting the epoxy resin. Known methods for surface treatment of metal hydrate particles include treating, for example, with a higher fatty acid, forming a silica layer, and the like. However, it is difficult to sufficiently disperse the particles under conventional reaction conditions, and a rate of coating reaction is fast. Therefore, there is a problem in that the particles are subjected to the coating reaction in an aggregated state, whereby uniform coated particles cannot be obtained.

In addition, if the surface treatment is insufficient, humidity resistance of the epoxy resin composition is deteriorated, and the epoxy resin may have poor solder crack resistance.

Further, since flame retardancy of the metal hydrates is lower than that of the halogen based flame-retardant agents, it is necessary to blend a large amount of metal hydrate in the resin to obtain necessary flame resistance. However, if a large amount of metal hydrate is blended in the resin, problems arise such as deterioration of dynamic performances of the resin and lowering of moldability of the resin.

SUMMARY OF THE INVENTION

The present invention provides a flame-retardant epoxy resin composition that has sufficient flame resistance without using a halogen based flame-retardant agent, and has good workability, moisture resistance reliability and solder crack resistance. The present invention also provides an electronic device, a laminated circuit board, a multilayered circuit board and a printed circuit board using the flame-retardant epoxy resin composition.

The invention comprises the following constitution.

(1) A flame-retardant epoxy resin composition, containing: an epoxy resin; an epoxy resin curing agent; and flame-retardant particles comprising a metal hydrate, the flame-retardant particles being provided with a coating layer on the surfaces thereof and having a volume average particle diameter in a range from 1 to 500 nm.

(2) An electronic device in which a flame-retardant epoxy resin composition containing: an epoxy resin; an epoxy resin curing agent; and flame-retardant particles comprising a metal hydrate, the flame-retardant particles being provided with a coating layer on the surfaces thereof and having a volume average particle diameter in a range from 1 to 500 nm as a sealing material.

(3) A laminated circuit board employing a flame-retardant epoxy resin composition containing: an epoxy resin; an epoxy resin curing agent; and flame-retardant particles comprising a metal hydrate, the flame-retardant particles being provided with a coating layer on the surfaces thereof and having a volume average particle diameter in a range from 1 to 500 nm.

(4) A multilayered circuit board employing a flame-retardant epoxy resin composition containing: an epoxy resin; an epoxy resin curing agent; and flame-retardant particles comprising a metal hydrate, the flame-retardant particles being provided with a coating layer on the surfaces thereof and having a volume average particle diameter in a range from 1 to 500 nm.

(5) A printed circuit board employing a flame-retardant epoxy resin composition containing: an epoxy resin; an epoxy resin curing agent; and flame-retardant particles comprising a metal hydrate, the flame-retardant particles being provided with a coating layer on the surfaces thereof and having a volume average particle diameter in a range from 1 to 500 nm.

DETAILED DESCRIPTION OF THE INVENTION

The present invention is described in detail below.

The flame-retardant epoxy resin composition of the invention comprises: an epoxy resin; an epoxy resin curing agent; and flame-retardant particles that contain a metal hydrate, are surface coated and have a volume average particle diameter in a range from 1-500 nm.

As described above, flame-retardant particles such as a metal hydrate, which is conventionally used as a flame-retardant agent, must be blended in an epoxy resin in a larger amount than halogen based flame-retardant agents to add the same level of flame resistance to the epoxy resin as the halogen based flame-retardant agents do. This significantly degrades physical properties of the epoxy resin. In order to prevent degradation of physical properties of the epoxy resin, it is necessary to achieve low charging of the flame-retardant agent.

It should be noted that the term "flame-retardant particles" refers to particles that can reduce, in comparison with an epoxy resin not containing the flame-retardant particles, a maximum heat generation rate (defined in ISO 5660-1) by 25% or more when 5 parts by mass of the flame-retardant particles are contained in 100 parts by mass of the epoxy resin.

As one method for achieving the low charging of the flame-retardant agent, the flame-retardant particles are made into fine particles having nanometer-order particle sizes to increase the specific surface area of the particles, i.e., to increase the contact area thereof with an epoxy resin. Thus, even a small addition of the flame-retardant particles to an epoxy resin can provide flame resistance that is equal to that provided by conventional halogen based flame-retardant agents. Since high flame resistance of the epoxy resin can be obtained by small addition of the flame-retardant particles thereto, useful physical properties such as strength and moldability of the epoxy resin are not impaired.

The flame-retardant particles containing the metal hydrate serving as a flame-retardant agent has two effects: an effect of decreasing heat by releasing water through thermal decomposition during burning, and an effect of diluting combustion gas generated from the epoxy resin during burning. It is known that, usually, these effects of the flame-retardant particles are not sufficiently exhibited unless a large amount of the flame-retardant particles are charged in the epoxy resin, however, such a phenomenon applies only in a case of conventional metal hydrate particles having micrometer-order particle sizes.

The present inventors have found that, by making the flame-retardant agent to have a nanometer-order particle size, the effects of decreasing heat and diluting combustion gas generated from the epoxy resin during burning can work more delicately and more effectively. Further, it has been found that, as discussed later, by forming a coating layer on the surfaces of the flame-retardant particles, dispersibility of the flame-retardant particles in the resin can be improved.

In addition, flame resistance of the epoxy resin can be improved more by using some flame-retardant agents in combination than using only one flame-retardant agent. It is preferred that the flame-retardant epoxy resin composition of the invention further contains a flame-retardant auxiliary selected from the group consisting of boric acid based flame-retardant auxiliaries, ammon based flame-retardant auxiliaries, inorganic flame-retardant auxiliaries, nitrogen based flame-retardant auxiliaries, organic flame-retardant auxiliaries and colloidal flame-retardant auxiliaries. It should be noted that, in the invention, flame-retardant agents and flame-retardant auxiliaries are distinguished by the blended amount, and those blended to a resin in a higher amount are called "flame-retardant agents", and those blended to the resin in a small amount to further enhance the flame retarding effect of the main flame-retardant agent are called "flame-retardant auxiliaries".

Char forming compounds used as flame-retardant auxiliaries have two effects: an effect of covering the surface of the epoxy resin to block oxygen during burning; and an effect of blocking combustibles emitted from the epoxy resin. This flame retarding effect of the char forming compounds is different from that of the metal hydrates.

In the invention, by combining the different effects of the metal hydrate and the char forming compound (flame-retardant auxiliary), the flame retarding effect is further enhanced.

More specifically, when the nanometer-size metal hydrate and the char forming compound are used in combination, superiority of the nanometer-size metal hydrate particles to conventional micrometer-size metal hydrate particles and the inherent effect of the char forming compound are combined, thereby enhancing the flame resistance of the epoxy resin more effectively than a combination of conventional micrometer-size metal hydrate particles and the char forming compound. The reason is believed to be a very small distance between the nanometer-size metal hydrate particles and the char forming compound in the epoxy resin.

Further, in the invention, by using the flame-retardant particles containing metal hydrate having a nanometer-order volume average particle diameter serving as the flame-retardant agent and the flame-retardant auxiliary that can form char in combination, a flame-retardant epoxy resin composition can be obtained in which generation of harmful gas during burning can be suppressed by the above described combined effects.

Now, components of the flame-retardant epoxy resin composition of the invention are described.

Flame-Retardant Particles

The flame-retardant particles containing the metal hydrate of the invention has a volume average particle diameter in a range from 1 to 500 nm. The volume average particle diameter of the flame-retardant particles is preferably in a range from 1 to 200 nm, more preferably in a range from 5 to 200 nm, even more preferably in a range from 10 to 200 nm, and particularly preferably in a range from 10 to 100 nm.

If the volume average particle diameter of the flame-retardant particles is smaller than 1 nm, flame retarding ability thereof is deteriorated. In contrast, if the volume average particle diameter of the flame-retardant particles is larger than 500 nm, properties of the flame-retardant particles are equal to commercially available flame-retardant particles having a volume average particle diameter of 1 µm, and therefore, it is necessary to add a large amount of the flame-retardant particles in the resin to obtain necessary flame resistance of the resin.

In addition, the flame-retardant particles having a volume average particle diameter within the above-defined range are dispersed uniformly in the epoxy resin. Further, the flame-retardant particles having a nanometer-size volume average particle diameter can form fine composites and can provide a highly transparent flame-retardant epoxy resin composition.

As the metal hydrate, a hydrate of a metal selected, for example, from Mg, Ca, Al, Fe, Zn, Ba, Cu and Ni can be used. Hydrates of these metals can be easily made into fine particles, are stable as a hydrate, and exhibit superior flame retarding effect because they have good heat absorbing property and good dehydration property when heated. Among the above metal hydrates, hydrates of Mg, Al and Ca are particularly preferred.

The metal hydrate for use in the invention is not particularly limited as long as the metal hydrate retains flame-retardant components. Specific examples thereof include: metal hydrates such as aluminum hydroxide, magnesium hydroxide, calcium hydroxide, iron hydroxide, zinc hydroxide, copper hydroxide and nickel hydroxide; and hydrates of calcium aluminate, gypsum dihydrate, zinc borate and barium metaborate. Further, composites of these hydrates are also preferably used. Among them, magnesium hydroxide, aluminum hydroxide and calcium hydroxide are preferred.

In addition, for the metal hydrate, a hydrate of metals (composite metal) containing Mg and one selected from the group consisting of Ca, Al, Fe, Zn, Ba, Cu and Ni can also be used. Such a composite metal containing Mg as an essential metal and one of various metals combined therewith can enhance the flame retarding effect. For example, when Mg and Ni or Fe are combined to form a composite metal, the composite metal provides a function of abstracting hydrogen from hydrocarbon deriving from resinous components that are vaporized during burning, to enhance flame retarding effect and smoke reducing effect of the resin composition. Further, when Mg and Al are combined to form a composite metal, the composite metal enhances flame retarding effect by controlling a water discharging temperature during burning.

In a case where a metal hydrate containing Mg and one selected from the group consisting of Ca, Al, Fe, Zn, Ba, Cu and Ni is used, the metal hydrate is represented by the following general formula (1):

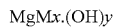   General Formula (1)

wherein M presents at least one metal selected from the group consisting of Ca, Al, Fe, Zn, Ba, Cu and Ni, x presents a real number from 0.1 to 10, and y presents an integer from 2 to 32.

Examples of preferably used MgMx include MgAlx, MgCax, MgZnx, MgFex and Mg(Al.Ca)x.

The flame-retardant particles for use in the invention have a coating layer formed on their surfaces. It is preferred that the flame-retardant particles have a total light transmittance in a range from 70 to 90% when 0.1 parts by mass of the flame-retardant particles are dispersed in 100 parts by mass of toluene. The total light transmittance of the flame-retardant particles dispersed in toluene can be used as a measure of a surface condition of the flame-retardant particles. The total light transmittance of 70% or more indicates that the surfaces of flame-retardant particles are sufficiently covered with the coating layer. The upper limit of the total light transmittance is set to 90%, since it is practically difficult to make the total light transmittance of the flame-retardant particles exceed 90%.

The total light transmittance is found in the following manner: dispersing 0.1 parts by mass of the flame-retardant particles in 100 parts by mass of toluene through sonication for 10 minutes, putting the dispersion in a 10×10 mm quartz cell, and measuring a transmittance of linear light having a wavelength of 550 nm through the dispersion using a visible light spectral photometer (UV-3600 manufacture by Shimadzu Corporation).

By forming the coating layer on the surfaces of the flame-retardant particles, dispersibility of the flame-retardant particles in the epoxy resin can be improved. Further, laminated circuit board, multilayered circuit boards and printed circuit boards formed by using the flame-retardant epoxy resin composition of the invention, as well as electronic devices in which the flame-retardant epoxy resin composition of the invention is used as a sealing materials can be improved in moisture resistance reliability and reflow resistance. A total light transmittances of less than 70% of the flame-retardant particles indicates that there are portions in the surfaces of the flame-retardant particles that are not covered with the coating layer, and if such flame-retardant particles are used, dispersibility of the flame-retardant particles in the epoxy resin may be lowered and moisture resistance reliability of the epoxy resin may be degraded.

The coating layer to be formed on the surfaces of the flame-retardant particles preferably contains an organic compound or polysilicone.

The organic compound for use in the coating layer is not particularly limited; however, one having an organic group that can bond with the flame-retardant particle is preferred.

By bonding such an organic group with the flame-retardant particle, a thin organic layer can be uniformly formed on the surface of the flame-retardant particle.

The organic compound preferably has a bonding group at a terminal of the organic group to form a bond with the flame-retardant particle.

Examples of the bonding group include hydroxyl group, phosphate group, phosphonium group, amino group, sulfate group, sulfonic group, carboxyl group, hydrophilic heterocyclic group, polysaccharide group (such as sorbitol, sorbitan, sucrose ester or sorbitan esters residue), polyether group (such as polyoxyalkylene group having 2 to 4 carbon atoms in alkylene, for example, polyoxyethylene or polyoxypropylene group), and hydrolyzable group (such as alkoxy group having 1 to 4 carbon atoms, e.g., methoxy, ethoxy, propoxy, isopropoxy or butoxy group; and halogen atom, e.g., bromine or chlorine atom).

In a case where the bonding group is an anionic group (such as a sulfate group, sulfonic group or carboxyl group), the anionic group may form a salt with various bases. Examples of the base include inorganic bases (alkaline earth metals such as calcium and magnesium; alkali metals such as sodium and potassium; and ammonia), and organic bases (such as amines). In a case where the bonding group is a cationic group (such as amino group), the cationic group may form a salt with an inorganic acid (such as hydrochloric acid or sulfuric acid), or an organic acid (such as acetic acid). The cationic group may form a salt with an anionic group (particularly, carboxyl group or sulfate group). Further, the bonding group may include both of a cationic group and an anionic group.

As described above, preferred examples of the bonding group include ionic groups (anionic group, cationic group) and hydrolyzable groups, and a bond formed between the bonding group and the flame-retardant particle may be an ionic bond or a covalent bond.

Examples of the organic group of the organic compound include groups that act as a hydrophobic group of a surfactant (such as a higher fatty acid residue, a higher alcohol residue, and alkyl-aryl group) and poly amino acid residue.

Specific examples of the higher fatty acid residue include saturated fatty acids having 8 to 30 carbon atoms (preferably saturated fatty acids having 10 to 28 carbon atoms, and more preferably saturated fatty acids having 12 to 26 carbon atoms) such as lauric acid, myristic acid, palmitic acid, arachic acid, behenic acid, lignoceric acid, cerotic acid, caprylic acid, capric acid, daturinic acid, stearic acid, montanic acid, melissic acid; unsaturated fatty acids having 12 to 30 carbon atoms (preferably unsaturated fatty acids having 14 to 28 carbon atoms, and more preferably unsaturated fatty acids having 14 to 26 carbon atoms) such as elaidic acid, linoleic acid, linolenic acid, lindelic acid, oleic acid, gadoleic acid, erucic acid and brassidic acid.

Examples of the higher alcohol residue include higher alcohol residues having 8 to 24 carbon atoms, preferably higher alcohol residues having 10 to 22 carbon atoms, and more preferably higher alcohol residues having 12 to 20 carbon atoms, such as octyl, nonyl, dodecyl, tetradecyl, hexadecyl(cetyl) and octadecyl.

Examples of the alkyl-aryl group include alkyl-aryl groups (preferably an alkyl-aryl group where alkyl has 1 to 20 carbon atoms and aryl has 6 to 18 carbon atoms, more preferably an alkyl-aryl group where alkyl has 6 to 18 carbon atoms and aryl has 6 to 12 carbon atoms, and particularly preferably an alkyl-phenyl group where alkyl has 6 to 16 carbon atoms) such as hexyl phenyl, octylphenyl, nonylphenyl, decylphenyl, dodecylphenyl, isopropylphenyl, butylphenyl, amyl phenyl and tetradecyl phenyl.

These hydrophobic groups may be substituted with various substituents (for example, an alkyl group having 1 to 4 carbon atoms).

The polysilicone is not particularly specified as long as it has a siloxane bond; however, it is preferable to use a polymer of a cyclic organosiloxane compound represented by the following general formulae (2):

General Formulae (2)

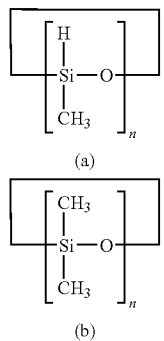

In the above formulae, n presents an integer from 3 to 8. Smaller the number represented by n, lower the boiling point, resulting in a greater quantity of the polysilicone volatilizing and adsorbing to the flame-retardant particles. The number represented by n greater than 7 is not preferable, because such a polysilicone is less volatile, resulting in insufficient coating. Particularly preferable n is 4, 5 or 6, because the three-dimensional characteristic of the polysilicone facilitates polymerization.

In the invention, one of the cyclic organosiloxane compounds (a) and (b) represented by general formulae (2) can be used, or both of them can be used in combination. A degree of polymerization (a number of repeat units) of the polymer is preferably in a range from 10 to 1000, and more preferably in a range from 10 to 100. Further, the polymer and the organic compound may used in combination in the coating layer.

Using the polysilicone having low surface energy such as described above as the coating layer, the epoxy resin having the flame-retardant particles mixed therein becomes less likely to plasticize.

If the flame-retardant epoxy resin composition is burned, the polysilicone layer at the surface of the flame-retardant particles forms a thermal barrier layer. With the polysilicone layer formed on the surfaces of the particles, moisture released from the metal hydrate particles makes the thermal barrier layer foam, thereby improving adiathermancy of the thermal barrier layer and enhancing the flame retarding effect.

A coating amount of the organic compound on the surface of the flame-retardant particles of the invention is preferably in a range from 1 to 200% by mass, more preferably in a range from 20 to 100% by mass, and even more preferably in a range from 30 to 80% by mass with respect to the metal hydrate. If the coating amount is less than 1% by mass, aggregates may generate in the epoxy resin and dispersion of the flame-retardant particles in the epoxy resin may be non-uniform. In contrast, if the coating amount exceeds 200% by mass, the epoxy resin having the flame-retardant particles dispersed therein may plasticize.

A coating amount of the polysilicone on the surface of the flame-retardant particles is preferably in a range from 20 to 200% by mass, and more preferably in a range from 20 to 80% by mass with respect to the metal hydrate. If the coating amount is less than 20% by mass, aggregates may generate in the epoxy resin and dispersion of the flame-retardant particles in the epoxy resin may be non-uniform. In contrast, if the coating amount exceeds 200% by mass, the epoxy resin having the flame-retardant particles dispersed therein may plasticize.

It should be noted that uniformity of the coating layer can be checked by observing the flame-retardant particles with a transmission electron microscope.

A degree of dispersion (dispersion degree) of the flame-retardant particles in the invention is preferably in a range from 0.1 to 3.0, more preferably in a range from 0.1 to 1.0, and particularly preferably in a range from 0.1 to 0.8.

A smaller degree of dispersion indicates that a particle size distribution of the flame-retardant particles is narrower, that is, uniformity of sizes of the particles is higher. When flame-retardant particles having a degree of dispersion within the above-mentioned range are dispersed in a resin, flame retardancy and mechanical characteristics of the resin become uniform.

The volume average particle diameter and the degree of dispersion are measured with a laser doppler heterodyne type particle size analyzer (MICROTRAC-UPA150 manufactured by UPA Nikkiso Co., Ltd.) (this is the same throughout the specification). Specifically, based on a measured particle size distribution, a cumulative distribution is plotted from a smaller particle size side with respect to volume, and a particle size where the accumulation is 50% is taken as a volume average particle diameter. When a particle size distribution is plotted with respect to mass, and a particle size where the accumulation is 90% from the smaller particle size side is represented by $D_{90}$, and a particle size where the accumulation is 10% is represented by $D_{10}$, the degree of dispersion is defined by the following equation (this measuring method is the same throughout the specification):

$$\text{Degree of dispersion} = \log(D_{90}/D_{10})$$

A method for producing the surface-coated flame-retardant particles is not particularly limited as long as the method can produce surface-coated flame-retardant particles that satisfy the above-described constitution and characteristics. For example: a method where metal hydrate particles are dispersed in an aqueous solution containing a metal salt of an organic compound and a dispersant dissolved therein to form a layer of the organic compound on the surfaces of the metal hydrate particles; a method where an evaporating material of an organosiloxane compound is made to act on the surfaces of the metal hydrate particles to form a polysilicone compound layer thereon; and a method where a metal salt of an alkyl acid is dispersed in an organic solvent to form a reverse micelle, and metal ion is oxidized into a metal oxide to form surface-coated particles are given. These methods are described in detail in Japanese Patent Application Nos. 2005-49009, 2005-49010 and 2005-49011.

An amount of the flame-retardant particles to be blended in the flame-retardant epoxy resin composition of the present invention is preferably in a range from 0.1 to 50 parts by mass, and more preferably in a range from 1 to 20 parts by mass with respect to 100 parts by mass of the epoxy resin (described in detail below).

<Epoxy Resin>

Epoxy resins usable in the invention includes a monomer, an oligomer or a polymer having two or more epoxy groups in a molecule thereof, and a molecular weight and a molecular structure thereof are not particularly limited. Examples of the epoxy resin include biphenyl type epoxy resin, bisphenol type epoxy resin, stilbene type epoxy resin, phenol novolak type epoxy resin, cresol novolak type epoxy resin, triphenol methane type epoxy resin, alkyl-modified triphenol methane type epoxy resin, triazine nucleus-containing epoxy resin, dicyclopentadiene-modified phenol type epoxy resin, and phenol aralphyl type epoxy resin (having a phenylene skeleton or a diphenylene skeleton). These epoxy resins may be used singly or in combination thereof.

Among them, biphenyl type epoxy resin, bisphenol type epoxy resin, stilbene type epoxy resin, phenol novolak type epoxy resin, cresol novolak type epoxy resin, and triphenol methane type epoxy resin are preferred. More preferred are biphenyl type epoxy resin, bisphenol type epoxy resin, phenol novolak type epoxy resin and cresol novolak type epoxy resin. Particularly preferred is biphenyl type epoxy resin.

An epoxy resin content in the flame-retardant epoxy resin composition of the invention is preferably in a range from 0.1 to 99% by mass, more preferably in a range from 1 to 80% by mass, and particularly preferably in a range from 5 to 50% by mass.

<Epoxy Resin Curing Agent>

An epoxy resin curing agent for use in the invention can be any of epoxy resin curing agents known to a person of ordinary skill in the art. Examples of the epoxy resin curing agent include: straight chain aliphatic diamines of $C_2$ to $C_{20}$ such as ethylene diamine, trimethylene diamine, tetramethylene diamine and hexamethylene diamine; metaphenylene diamine, paraphenylene diamine, paraxylene diamine, 4,4'-diaminodiphenyl methane, 4,4'-diaminodiphenyl propane, 4,4'-diaminodiphenyl ether, 4,4'-diaminodiphenylsulphone, 4,4'-diaminodicyclohexane, bis(4-aminophenyl)phenyl methane, 1,5-diaminonaphthalene, metaxylene diamine, paraxylene diamine, 1,1-bis(4-aminophenyl)cyclohexane; aminos such as dicyanodiamide, resol type phenol resins such as aniline-modified resol resin and dimethylether resol resin, novolak type phenol resins such as phenol novolak resin, cresol novolak resin, tert-butylphenol novolak resin and nonylphenol novolak resin; polyoxy styrenes such as poly paraoxy styrene; phenol resins such as phenol aralkyl resin; and acid anhydrides. However, these examples are not intended to limit the invention.

Among them, resol type phenol resins such as aniline modified resol resin and dimethylether resol resin; novolak type phenol resins such as phenol novolak resin, cresol novolak resin, tert-butylphenol novolak resin and nonylphenol novolak resin; polyoxy styrenes such as polyparaoxy styrene; and phenol resins such as phenol aralkyl resin are preferred. More preferred are novolak type phenol resins and phenol aralkyl resins. Particularly preferred are phenol aralkyl resins.

A content of the epoxy resin curing agent in the flame-retardant epoxy resin composition of the invention is preferably in a range from 0.1 to 99% by mass, more preferably in a range from 1 to 80% by mass, and particularly preferably in a range from 5 to 50% by mass.

<Flame-Retardant Auxiliary>

A flame-retardant auxiliary for use in the invention is preferably one selected from the group consisting of boric acid based flame-retardant auxiliaries, ammon based flame-retardant auxiliaries, inorganic flame-retardant auxiliaries, nitrogen based flame-retardant auxiliaries, organic flame-retardant auxiliaries, and colloidal flame-retardant auxiliaries.

Examples of boric acid based flame-retardant auxiliaries include compounds containing boric acid such as zinc borate hydrate, barium metaborate and borax.

Examples of ammon based flame-retardant auxiliaries include ammonia compounds such as ammonium sulfate.

Examples of inorganic flame-retardant auxiliaries include: iron oxide based burning catalysts such as ferrocene; compounds containing titanium such as titanium oxide; guanidine based compounds such as guanidine sulfamate; zirconium based compounds; molybdenum based compounds; tin based compounds; carbonate compounds such as potassium carbonate; metal hydrates such as aluminum hydroxide and magnesium hydroxide; and modified products thereof.

Examples of nitrogen based flame-retardant auxiliaries include cyanurate compounds having a triazine ring.

Examples of organic flame-retardant auxiliaries include chlorendic anhydride, phthalic anhydride, compounds containing bisphenol A, glycidyl compounds such as glycidyl ether, polyalcohols such as diethylene glycol and pentaerythritol, modified carbamide, silicone oil, and silicone compounds such as organosiloxane.

Examples of colloidal flame-retardant auxiliaries include colloids of flame-retardant compounds such as conventionally used metal hydrates having flame retarding property such as aluminum hydroxide, magnesium hydroxide and calcium hydroxide, hydrates of calcium aluminate, gypsum dihydrate, zinc borate, barium metaborate, borax and kaolin clay, nitric acid compounds such as sodium nitrate, and molybdenum compounds, zirconium compounds, antimony compounds, Dawsonite and phlogopite.

Many of the above-mentioned various flame-retardant auxiliaries are water-soluble or hydrophilic, and they may be used singly or in combination thereof. From the standpoint of obtaining excellent flame retarding effects with a relatively small amount of the flame-retardant auxiliary, the flame-retardant auxiliary for use in the invention is preferably at least one selected from the group consisting of the boric acid based flame-retardant auxiliaries, the inorganic flame-retardant auxiliaries, the nitrogen based flame-retardant auxiliaries, the organic flame-retardant auxiliaries and the colloidal flame-retardant auxiliaries. Among them, the boric acid based flame-retardant auxiliaries are more preferable.

A content of the flame-retardant auxiliary in the flame-retardant epoxy resin composition of the invention is preferably in a range from 0.1 to 50 parts by mass, and more preferably in a range from 1 to 20 parts by mass for 100 parts by mass of the epoxy resin.

<Curing Accelerator>

A curing accelerator may be added to the flame-retardant epoxy resin composition of the invention, as necessary, to accelerate curing reaction of the epoxy resin. The curing accelerator may be any of known and commonly used curing accelerators. Examples thereof include Lewis acid, amine complex salt, imidazole compound, organophosphorus compound, tertiary amine and quaternary ammonium salt. Further examples of the curing accelerator include imidazole formed by masking an imino group with acrylonitrile, isocyanate, melamine, acrylate or epoxy. Examples of imidazole compounds include imidazole, 2-ethylimidazole, 2-ethyl-4-methyl imidazole, 2-phenylimidazole, 2-undecylimidazole, 1-benzyl-2-methylimidazole, 2-heptadecylimidazole, 4,5-diphenylimidazole, 2-methylimidazoline, 2-ethyl-4-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline and 2-phenyl-4-methylimidazoline. Examples of a masking agent include acrylonitrile, phenylene diisocyanate, toluene diisocyanate, naphthalene diisocyanate, hexamethylene diisocyanate, methylenebisphenyl isocyanate, melamine acrylate and various epoxides. In addition, as the curing accelerator, diazabicyclo alkenes and derivatives thereof such as 1,8-diazabicyclo(5,4,0)undecene-7; tertiary amines such as triethylenediamine, benzyldimethylamine, triethanolamine, dimethylaminoethanol and tris(dimethylaminomethyl)phenol; organic phosphines such as tributylphosphine, methyldiphenylphosphine and triphenylphosphine; tetra-substituted phosphonium tetra-substituted borate such as tetraphenylphosphonium tetraphenylborate; and tetraphenylboron salts such as 2-ethyl-4-methylimidazole tetraphenylborate and N-methylmorpholine tetraphenylborate can be used. These curing accelerators may be used in combination thereof.

Among them, imidazole, diazabicyclo alkene and derivatives thereof, and organic phosphines are preferred; diazabicyclo alkene and derivatives thereof and organic phosphines are more preferred; and diazabicyclo alkene and derivatives thereof are particularly preferred.

A content of the curing accelerator in the flame-retardant epoxy resin composition of the invention is preferably in a range from 0.0001 to 10% by mass, more preferably in a range from 0.0001 to 5% by mass, and particularly preferably in a range from 0.0001 to 3% by mass.

<Filler>

The flame-retardant epoxy resin composition of the invention may further contain a filler for reducing hygroscopic property, reducing coefficient of linear expansion, enhancing mechanical strength, achieving high thermal conduction, and the like, as required.

Specific examples of the filler include silica powder such as fused silica, alumina, talc, calcium carbonate, clay and mica. Further, known additives in the art such as natural waxes, synthetic waxes, metal oxides of straight chain aliphatic acids, acid amides, esters, mold releasing agents such as paraffin, colorants such as carbon black and red iron oxide, and various coupling agents can be used, as necessary.

A content of the filler in the flame-retardant epoxy resin composition of the invention is preferably in a range from 0.1 to 99% by mass, more preferably in a range from 1 to 95% by mass, and particularly preferably in a range from 10 to 95% by mass.

The flame-retardant epoxy resin composition of the invention can be obtained by mixing the epoxy resin, the epoxy resin curing agent and the flame-retardant particles, as well as those used as necessary such as the flame-retardant auxiliary, the curing accelerator and the filler, and kneading them in a kneading machine.

The type of the kneading machine is not particularly limited. From a view point of obtaining high dispersibility, preferable methods are: a method where the flame-retardant particles are dispersed by a shear stress and repeated positional changes effected with a three-roll or two-roll kneader; and a method where the flame-retardant particles are dispersed by a collision force against the wall of a disperser and a shear force effected with a kneader, a Banbury mixer, an Intermix, a uniaxial extruder or a biaxial extruder.

A temperature for kneading varies depending on types and amounts of the epoxy resin, the epoxy resin curing agent, the flame-retardant particles, and the like to be used, and a preferable range thereof is from 0 to 200° C., and a more preferable range thereof is from 10 to 100° C.

The flame-retardant epoxy resin composition of the invention can be used as a sealing material for semiconductors (such as DIP, SOP, TSOP, SOJ, QFP and BGA/CSP), organic electroluminescence devices, and electronic parts such as resistors and inductors. Electronic devices employing the flame-retardant epoxy resin composition of the invention as a sealing material have good moisture resistance reliability and solder crack resistance. Since the flame-retardant epoxy resin composition of the invention does not contain a halogen based flame-retardant agent and a phosphorus based flame-retardant agent, electronic devices having good corrosion resistance can be obtained.

Moreover, the flame-retardant epoxy resin composition of the invention can be preferably used as a resin material for forming laminated substrates, multilayered circuit boards and printed circuit boards. Laminated circuit boards, multilayered circuit boards and printed circuit boards employing the flame-retardant epoxy resin composition of the invention have good workability, moisture resistance reliability and solder crack resistance.

The flame-retardant particles contained in the epoxy resin composition of the invention preferably have a total light transmittance in a range from 70 to 90% when 0.1 parts by mass of the flame-retardant particles are dispersed in 100 parts by mass of toluene.

The metal hydrate for use in the epoxy resin composition of the invention is preferably a hydrate of metals containing Mg and one selected from the group consisting of Ca, Al, Fe, Zn, Ba, Cu and Ni.

The metal hydrate for use in the epoxy resin composition of the invention is preferably a hydrate of a metal selected from the group consisting of Mg, Ca, Al, Fe, Zn, Ba, Cu and Ni.

The coating layer formed on the surfaces of the flame-retardant particles preferably contains an organic compound or polysilicone.

It is preferred that the flame-retardant epoxy resin composition further contains a flame-retardant auxiliary selected from the group consisting of boric acid based flame-retardant auxiliaries, ammon based flame-retardant auxiliaries, inorganic flame-retardant auxiliaries, nitrogen based flame-retardant auxiliaries, organic flame-retardant auxiliaries and colloidal flame-retardant auxiliaries.

The flame-retardant epoxy resin composition preferably contains a curing accelerator.

The flame-retardant epoxy resin composition preferably contains a filler.

EXAMPLES

Hereinafter, the present invention is described in more detail with reference to Examples; however, these Examples are not intended to limit the invention.

—Preparation of Flame-Retardant Particles—

(Preparation of Flame-Retardant Particles 1 (Coated with a Silicone Compound))

100 parts by mass of magnesium hydroxide particles having a volume average particle diameter of 495 nm as the flame-retardant particles, and 200 parts by mass of octamethylcyclotetrasiloxane as the cyclic organosiloxane compound are weighed in separate glass vessels. These glass vessels are placed in a desiccator that is sealable and pressure-reducible. Then, an internal pressure of the desiccator is reduced to 80 mmHg with a vacuum pump, and the desiccator is sealed up. Subsequently, the desiccator is left for 12 hours at an environment of 60° C. for surface treatment. Thereafter, flame-retardant particles 1 (coated with a silicone compound), thus surface-treated, are taken out from the glass vessel.

The resulting flame-retardant particles 1 (coated with a silicone compound) have a volume average particle diameter of 495 nm and a dispersion degree (degree of dispersion) of 0.5. Further, the flame-retardant particles 1 (coated with a silicone compound) are precisely weighed and a surface coating amount thereof is calculated to be 20% by mass. The flame-retardant particles 1 (coated with a silicone compound) are observed with a transmission electron microscope and found to be uniformly coated.

Magnesium hydroxide particles having a volume average particle diameter of 495 nm (without a coating) are taken as flame-retardant particles 1 (without a coating).

(Preparation of Flame-Retardant Particles 1 (Coated with a Long Chain Carboxylic Acid))

1,000 ml of ion-exchanged water is placed in a 2,000 ml separable flask, and 100 parts by mass of sodium isostearate as the metal salt of an organic compound (9.1% by mass) and 5 parts by mass of polypropyl cellulose as the dispersant are added thereto and are heated to be dissolved. After the flask is cooled off to room temperature, 50 parts by mass (dispersion concentration: 45.2% by mass) of composite particles of magnesium hydroxide/aluminum hydroxide $(MgAl_x.(OH)_y$, where x is 2 and y is 8) having a volume average particle diameter of 495 nm as the flame-retardant particles are added thereto, and are subjected to agitation/ultrasonication to prepare a dispersion.

Subsequently, 200 parts by mass of 2% by mass hydrochloric acid is added dropwise at a rate of 200 ml/hour while the dispersion is agitated and ultrasonicated. After the addition of hydrochloric acid has been completed, the dispersion is converted into a magnesium hydroxide/aluminum hydroxide sol. Then, the resulting magnesium hydroxide/aluminum hydroxide sol is dissolved in toluene, and the sol is precipitated again with a centrifugal separator. The precipitate is dried in a vacuum dryer to obtain flame-retardant particles 1 (coated with a long chain carboxylic acid).

The resulting flame-retardant particles 1 (coated with a long chain carboxylic acid) have a volume average particle diameter of 495 nm and a dispersion degree of 0.5. Further, the flame-retardant particles 1 (coated with a long chain carboxylic acid) are precisely weighed and a surface coating amount thereof is calculated to be 30% by mass. The flame-retardant particles 1 (coated with a long chain carboxylic acid) are observed with a transmission electron microscope (FEI Company TecnaiG2) and found to be uniformly coated.

(Preparation of Flame-Retardant Particles 2)

Flame-retardant particles 2 are obtained in the same manner as the flame-retardant particles 1 (coated with a silicone compound), except that 200 parts by mass of magnesium hydroxide particles having a volume average particle diameter of 80 nm are used as the flame-retardant particles.

The resulting flame-retardant particles 2 have a volume average particle diameter of 80 nm and a dispersion degree of 0.5. Further, the flame-retardant particles 2 are precisely weighed and a surface coating amount thereof is calculated to be 50% by mass. The flame-retardant particles 2 are observed with a transmission electron microscope and found to be uniformly coated.

(Preparation of Flame-Retardant Particles 3)

Flame-retardant particles 3 are obtained in the same manner as the flame-retardant particles 1 (coated with a silicone compound), except that 400 parts by mass of magnesium hydroxide particles having a volume average particle diameter of 10 nm are used as the flame-retardant particles.

The resulting flame-retardant particles 3 have a volume average particle diameter of 10 nm and a dispersion degree of 0.5. Further, the flame-retardant particles 3 are precisely weighed and a surface coating amount thereof is calculated to be 80% by mass. The flame-retardant particles 3 are observed with a transmission electron microscope and found to be uniformly coated.

(Preparation of Flame-Retardant Particles 4)

Flame-retardant particles 4 are obtained in the same manner as the flame-retardant particles 1 (coated with a silicone compound), except that 200 parts by mass of magnesium hydroxide particles having a volume average particle diameter of 800 nm are used as the flame-retardant particles.

The resulting flame-retardant particles 4 have a volume average particle diameter of 800 nm and a dispersion degree of 5.0. Further, the flame-retardant particles 4 are precisely weighed and a surface coating amount thereof is calculated to be 15% by mass. The flame-retardant particles 4 are observed with a transmission electron microscope and found to have uncoated portions.

(Preparation of Flame-Retardant Particles 5)

Flame-retardant particles 5 are obtained in the same manner as the flame-retardant particles 1 (coated with a silicone compound), except that 200 parts by mass of magnesium hydroxide particles having a volume average particle diameter of 2000 nm are used as the flame-retardant particles.

The resulting flame-retardant particles 5 have a volume average particle diameter of 2000 nm and a dispersion degree of 6.0. Further, the flame-retardant particles 5 are precisely weighed and a surface coating amount thereof is calculated to be 10% by mass. The flame-retardant particles 5 are observed with a transmission electron microscope and found to have uncoated portions.

(Preparation of Flame-Retardant Particles 6)

Flame-retardant particles 6 are obtained in the same manner as the flame-retardant particles 1 (coated with a silicone compound), except that 200 parts by mass of magnesium hydroxide particles having a volume average particle diameter of 80 nm are used as the flame-retardant particles and the amount of the octamethylcyclotetrasiloxane is changed to 20 parts by mass.

The resulting flame-retardant particles 6 have a volume average particle diameter of 80 nm and a dispersion degree of 3.5. Further, the flame-retardant particles 6 are precisely weighed and a surface coating amount thereof is calculated to be 10% by mass. The flame-retardant particles 6 are observed with a transmission electron microscope and found to have uncoated portions.

Example (Ex.) 1

50 parts by mass of biphenyl based epoxy resin (YX-4000 manufactured by Yuka Shell Epoxy K.K.) as the epoxy resin, 50 parts by mass of phenol resin (XL-225 manufactured by Mitsui Chemicals, Inc.) as the epoxy resin curing agent, 1 part by mass of 1,8-diazabicyclo(5,4,0)undecene (DBU) as the curing accelerator, and 10 parts by mass of the flame-retardant particles 1 (coated with a silicone compound) are kneaded with a hot roll, and are cooled and milled to obtain a flame-retardant epoxy resin composition. The resulting flame-retardant epoxy resin composition is evaluated for total light transmittance, flame resistance, workability, high temperature storability and solder crack resistance according to the methods described below. The results are shown in Table 1. A unit for numerical values in Table 1 is "part by mass" unless otherwise specified.

<Total Light Transmittance>

Total light transmittance (%) is evaluated based on the method described above.

<Flame Resistance>

Test pieces (127 mm×12.7 mm×3.2 mm) are molded with a low pressure transfer molder (manufactured by Marushichi Tekko) under conditions of a die temperature of 175° C., an injection pressure of 9.8 MPa and a curing time of 120 seconds. Subsequently, the test pieces are after-baked at 175° C. for 8 hours. Then, the test pieces are evaluated with respect to flame resistance based on the following criteria according to UL94 vertical testing procedure:

A: when V-0 is satisfied;

B: when V-1 or V-2 is satisfied; and

C: when V-2 is not satisfied.

<Workability>

Test pieces (127 mm×12.7 mm×3.2 mm) are molded with a low pressure transfer molder (manufactured by Marushichi Tekko) under conditions of a die temperature of 175° C., an injection pressure of 9.8 MPa and a curing time of 120 seconds. The resulting test pieces are examined with respect to presence of a void therein, and are evaluated with respect to workability according to the following criteria:

A: when there is no void;

B: when a total volume of voids is less than 5% of the volume of the test piece; and C: when a total volume of voids is 5% or more of the volume of the test piece.

<High Temperature Storability>

16-pin SOPs of dummy devices wired with a 25 μm-diameter gold wire are transfer-molded under conditions of a die temperature of 175° C., an injection pressure of 6.9 MPa and a curing time of 2 minutes, and are post-cured at 175° C. for 8 hours. The 16-pin SOPs are heated in a constant temperature bath at 185° C., and a resistance between the pins of each package is measured at constant time intervals. Each package is examined as to whether the resistance thereof has increased from its initial resistance by 10% or more, and evaluated with respect to high temperature storability according to the following criteria:

A: when an increase from the initial resistance is less than 10%; and

C: when an increase from the initial resistance is 10% or more.

<Solder Crack Resistance>

100-pin TQFPs (package size: 14×14 mm, thickness: 1.4 mm, silicon chip size: 8.0×8.0 mm, lead frame: 42 alloy) are molded with a low pressure transfer molder (manufactured by Marushichi Tekko) under conditions of a die temperature of 175° C., an injection pressure of 9.8 MPa and a curing time of 120 seconds, and are post-cured at 175° C. for 8 hours. The packages are left for 168 hours in an environment of 85° C. and 85% RH, and are dipped in a solder bath at 240° C. for 10 seconds. The packages are examined with respect to presence of an outer crack, and are evaluated with respect to solder crack resistance according to the following criteria:

A: when there is no outer crack; and

C: when there is an outer crack.

Examples 2 to 5 and Comparative Examples (Comp. Ex.) 1 to 4

Flame-retardant epoxy resin compositions of Examples 2 to 5 and Comparative Examples 1 to 4 are prepared in the same manner as in Example 1, except that the types and amounts of the epoxy resin, the phenol resin, the flame-retardant particles, the flame-retardant auxiliary and the curing accelerator are varied as shown in Table 1. The resulting flame-retardant epoxy resin compositions are evaluated in the same manner as in Example 1. The results are shown in Table 1. It should be noted that, in Example 5, zinc borate is used as the flame-retardant auxiliary.

TABLE 1

| Contents of composition | Coating layer | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
| Epoxy resin | | 50 | 50 | 50 | 50 | 50 | 50 | 50 | 50 | 50 |
| Phenol resin | | 50 | 50 | 50 | 50 | 50 | 50 | 50 | 50 | 50 |
| Flame-retardant particles 1 (495 nm) | Silicone compound | 10 | | | | 5 | | | | |
| Flame-retardant particles 1 (495 nm) | Long-chain carboxylic acid | | 10 | | | | | | | |
| Flame-retardant particles 1 (495 nm) | None | | | | | | 10 | | | |
| Flame-retardant particles 2 (80 nm) | Silicone compound | | | 10 | | | | | | |
| Flame-retardant particles 3 (10 nm) | Silicone compound | | | | 10 | | | | | |
| Flame-retardant particles 4 (800 nm) | Silicone compound | | | | | | | | 10 | |
| Flame-retardant particles 5 (2000 nm) | Silicone compound | | | | | | | | | 10 |
| Flame-retardant particles 6 (80 nm) | Silicone compound | | | | | | | 10 | | |
| Flame-retardant auxiliary | | | | | | 5 | | | | |
| Curing accelerator | | 1 | 1 | 1 | 1 | 1 | 1 | 1 | 1 | 1 |
| Total light transmittance (%) | | 74 | 85 | 90 | 87 | 80 | 5 | 24 | 65 | 11 |
| Flame resistance | | A | A | A | A | A | C | B | A | C |
| Workability | | A | A | A | A | A | C | B | B | A |

TABLE 1-continued

| Contents of composition | Coating layer | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
| High temperature storability | | A | A | A | A | A | C | C | A | A |
| Solder crack resistance | | A | A | A | A | A | C | C | A | A |

As can be seen from Table 1, the epoxy resin compositions of the invention have sufficient flame resistance without containing a halogen based flame-retardant agent, and have good workability, moisture resistance reliability and solder crack resistance. Further, an electronic device employing the flame-retardant epoxy resin composition of the invention as a sealing material, a laminated circuit board employing the flame-retardant epoxy resin composition of the invention, a multilayered circuit board employing the flame-retardant epoxy resin composition of the invention and a printed circuit board employing the flame-retardant epoxy resin composition of the invention are produced, and they are found to have good flame resistance, workability, moisture resistance reliability and solder crack resistance.

What is claimed is:

1. A laminated circuit board comprising a flame-retardant epoxy resin composition, comprising:
    an epoxy resin;
    an epoxy resin curing agent; and
    flame-retardant particles containing a metal hydrate, with a coating layer on a surface of the flame retardant particles and having a volume average particle diameter in a range from 1 to 500 nm,
    wherein the coating layer is a coating compound having a mass percentage range of 30-80% with respect to the metal hydrate.

2. The laminated circuit board of claim 1, wherein the flame-retardant particles have a total light transmittance in a range from 70 to 90% when 0.1 parts by mass of the flame-retardant particles are dispersed in 100 parts by mass of toluene.

3. The laminated circuit board of claim 1, wherein the metal hydrate is a hydrate of metals comprising Mg and one selected from the group consisting of Ca, Al, Fe, Zn, Ba, Cu and Ni.

4. The laminated circuit board of claim 1, wherein the metal hydrate is a hydrate of a metal selected from the group consisting of Mg, Ca, Al, Fe, Zn, Ba, Cu and Ni.

5. The laminated circuit board of claim 1, wherein the coating layer includes an organic compound or a polysilicone.

6. The laminated circuit board of claim 1, the flame-retardant epoxy resin composition further comprising a flame-retardant auxiliary selected from the group consisting of boric acid based flame-retardant auxiliaries, ammon based flame-retardant auxiliaries, inorganic flame-retardant auxiliaries, nitrogen based flame-retardant auxiliaries, organic flame-retardant auxiliaries and colloidal flame-retardant auxiliaries.

7. The laminated circuit board of claim 1, the flame-retardant epoxy resin composition further comprising a curing accelerator.

8. The laminated circuit board of claim 1, the flame-retardant epoxy resin composition further comprising a filler.

9. A laminated circuit board of claim 1, wherein the volume average particle diameter of the flame-retardant particles is in a range from 10 to 80 nm.

10. The laminated circuit board of claim 1, wherein the flame-retardant particles have a total light transmittance in a range from 85 to 90% when 0.1 parts by mass of the flame-retardant particles are dispersed in 100 parts by mass of toluene.

11. A multilayered circuit board comprising a flame-retardant epoxy resin composition, comprising:
    an epoxy resin;
    an epoxy resin curing agent; and
    flame-retardant particles containing a metal hydrate, with a coating layer on a surface of the flame retardant particles and having a volume average particle diameter in a range from 1 to 500 nm,
    wherein the coating layer is a coating compound having a mass percentage range of 30-80% with respect to the metal hydrate.

12. The multilayered circuit board of claim 11, wherein the flame-retardant particles have a total light transmittance in a range from 70 to 90% when 0.1 parts by mass of the flame-retardant particles are dispersed in 100 parts by mass of toluene.

13. The multilayered circuit board of claim 11, wherein the metal hydrate is a hydrate of metals comprising Mg and one selected from the group consisting of Ca, Al, Fe, Zn, Ba, Cu and Ni.

14. The multilayered circuit board of claim 11, wherein the metal hydrate is a hydrate of a metal selected from the group consisting of Mg, Ca, Al, Fe, Zn, Ba, Cu and Ni.

15. The multilayered circuit board of claim 11, wherein the coating layer includes an organic compound or a polysilicone.

16. The multilayered circuit board of claim 11, the flame-retardant epoxy resin composition further comprising a flame-retardant auxiliary selected from the group consisting of boric acid based flame-retardant auxiliaries, ammon based flame-retardant auxiliaries, inorganic flame-retardant auxiliaries, nitrogen based flame-retardant auxiliaries, organic flame-retardant auxiliaries and colloidal flame-retardant auxiliaries.

17. The multilayered circuit board of claim 11, the flame-retardant epoxy resin composition further comprising a curing accelerator.

18. The multilayered circuit board of claim 11, the flame-retardant epoxy resin composition further comprising a filler.

19. The multilayered circuit board of claim 11, the flame-retardant epoxy resin composition wherein the volume average particle diameter of the flame-retardant particles is in a range from 10 to 80 nm.

20. The multilayered circuit board of claim 11, wherein the flame-retardant particles have a total light transmittance in a range from 85 to 90% when 0.1 parts by mass of the flame-retardant particles are dispersed in 100 parts by mass of toluene.

* * * * *